United States Patent
Kato et al.

(12) 
(10) Patent No.: US 6,194,771 B1
(45) Date of Patent: Feb. 27, 2001

(54) SEMICONDUCTOR LIGHT-RECEIVING DEVICE HAVING SLOPED GROOVE IN LIGHT RECEIVING SURFACE

(75) Inventors: Masanobu Kato; Ryozo Furukawa, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/124,071

(22) Filed: Jul. 29, 1998

(30) Foreign Application Priority Data

Nov. 25, 1997 (JP) .................................................. 9-323442

(51) Int. Cl.[7] .................... H01L 31/0236; H01L 31/0232
(52) U.S. Cl. ............................ 257/436; 257/433; 257/466
(58) Field of Search ..................................... 257/436, 466, 257/80, 81, 82, 84, 85, 432, 458, 465, 622, 623, 433, 434; 372/108, 50

(56) References Cited

U.S. PATENT DOCUMENTS

| | | | |
|---|---|---|---|
| 3,150,999 | * 9/1964 | Rudenberg et al. | 136/89 |
| 4,698,129 | * 10/1987 | Puretz et al. | 156/643 |
| 5,032,879 | * 7/1991 | Buchmann et al. | 357/19 |
| 5,258,991 | * 11/1993 | Peterson | 372/50 |
| 5,374,588 | * 12/1994 | Moon | 437/129 |
| 5,438,208 | * 8/1995 | Takemoto | 250/551 |
| 5,619,518 | * 4/1997 | Horie et al. | 372/46 |
| 5,665,985 | * 9/1997 | Iwata | 257/95 |
| 5,920,587 | * 7/1999 | Narui et al. | 372/50 |

FOREIGN PATENT DOCUMENTS 07202263    8/1995   (JP) .

OTHER PUBLICATIONS

Sze, Physics of Semiconductor Devices, John Wiley & Sons, 1981.*

* cited by examiner

Primary Examiner—Jerome Jackson, Jr.
Assistant Examiner—Bradley W. Baumeister
(74) Attorney, Agent, or Firm—Jones Volentine, L.L.C.

(57) ABSTRACT

A semiconductor light-receiving device includes a light-receiving section that receives an input light. The light-receiving section includes a light-receiving surface to which the input light is directed, a groove extending vertically into the light-receiving surface, and a thin film coated on the inside wall of the groove.

19 Claims, 10 Drawing Sheets

SEMICONDUCTOR LIGHT-RECEIVING DEVICE HAVING SLOPED GROOVE IN LIGHT RECEIVING SURFACE

CROSS REFERENCE TO RELATED APPLICATION

This application claims the priority of Application No. H09-323442, filed Nov. 25, 1997 in Japan, the subject matter of which is incorporated herein by reference.

TECHNICAL FIELD OF THE INVENTION

The present invention relates to a semiconductor light-receiving device, and more particularly to, a side-(wall) surface-incident type of semiconductor light-receiving device for flat surface mounting, used for 1 μm band optical communication and the like.

BACKGROUND OF THE INVENTION

In general, a conventional semiconductor light-receiving device has a pin junction epi-wafer that includes an n-type buffer layer, an I-type light absorbing layer and a p-type cap layer laminated on a semiconductor substrate. In a semiconductor light-receiving device, disclosed in Japanese Laid open patent publication H7-202263, a light-receiving section is formed on a semiconductor substrate by shaping layered structure into a preferable shape.

One side-(wall) surface of the light-receiving section is a light-receiving surface, which is arranged vertical to the upper surface of the semiconductor substrate. An electrode is formed on the p-type cap layer of the light-receiving section; and an electrode is also formed on the back surface of the substrate.

In the semiconductor light-receiving device, light is not wave-guided to the I-type light absorbing layer inside the device. Therefore, the coupling efficiency of light cannot be improved and the density of the electric charge becomes high only around the light-receiving surface. As a result, a deterioration of the signal frequencies is extracted through the buffer layer or the cap layer. Providing a wave-guiding channel structure having a wave-guiding channel may solve this problem. The wave-guide channel structure wave-guides light to the I-type light absorbing layer inside the device; however, the application of the wave-guiding channel structure significantly increases the manufacturing cost of semiconductor light-receiving devices and is thus impractical.

The light-receiving surface may be curved to improve the coupling efficiency of this semiconductor light-receiving device, thus enlarging the exposed area of the I-type light absorbing layer relative to the light-receiving surface. Even though, however, an improvement in the coupling efficiencies is attempted by increasing the exposed area of the I-type light absorbing layer relative to the light-receiving surface with e.g., the curved light-receiving surface, the coupling efficiency is still small and there is still technical dissatisfaction over a deterioration of frequencies.

SUMMARY OF THE INVENTION

Accordingly, an object of the invention is to provide a semiconductor light-receiving device, in which a high coupling efficiency is obtained and a frequency deterioration is minimized.

According to a first aspect of the invention, a semiconductor light-receiving device includes a light-receiving section that receives an input light. The light-receiving section includes a light-receiving surface to which the input light is directed, a groove extending vertically into the light-receiving surface, and a thin film coated on the inside wall of the groove.

In the semiconductor light-receiving device, the thin film may be formed to have a refractive index that is smaller than that of a light absorbing layer and have a photoluminescence wavelength that is shorter than that of the light absorbing layer.

In the above-described first aspect of the invention, an input light reaches the light-receiving surface of the light-receiving section. The light is absorbed by the light absorbing layer of the light-receiving surface, while the light reached the groove is wave-guided to the light absorbing layer by the thin film.

According to a second aspect of the invention, a semiconductor light-receiving device includes a light-receiving section that receives an input light. The light-receiving section includes a light-receiving surface to which the input light is directed; and a groove extending vertically into the light-receiving surface. The groove is provided with a mesa surface on its inside wall.

According to a third aspect of the invention, a semiconductor light-receiving device includes a light-receiving section that receives an input light; and a resin member covering the light-receiving section. The light-receiving section includes a light-receiving surface to which the input light is directed; a groove extending vertically into the light-receiving surface; and an inserted material filled in the groove to wave-guide the input light into the light-receiving section. The inserted material has a refraction index smaller than that of the resin member.

In the above-described third aspect of the invention, the input light provided from outside is refracted by the resin member, and reaches the light-receiving surface and the inserted material (wave-guiding channel) in the groove. The inserted material refracts the light and guides it to the side (wall) surfaces of the groove, thus guiding the light to the light absorbing layer in the side (wall) surface.

In each aspect of the invention, the groove may be designed to have a mesa surface on its inside wall, so that the input light is refracted at the mesa surface, and enters the light absorbing layer.

The groove may be arranged at the center of the light-receiving surface, so that coupling efficiency is highest around the groove when an optical fiber is aligned relative to the groove. Therefore, the alignment of the optical fiber is automatically conducted in a preferable manner.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DISCLOSURE OF THE INVENTION

Figure 1:
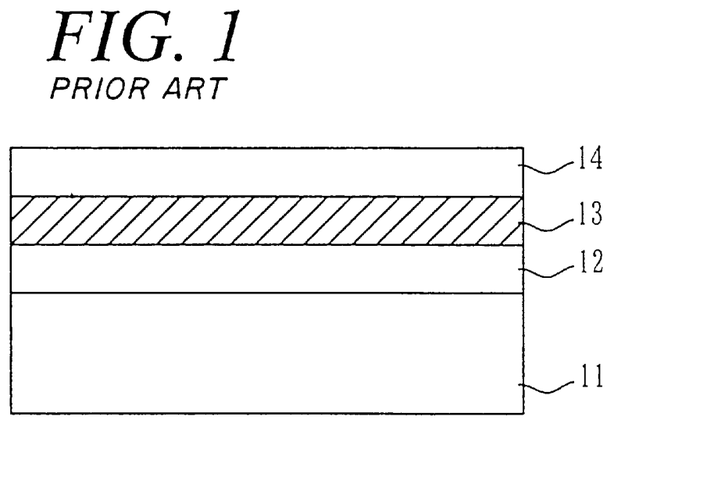
FIG. 1 is a cross-sectional view illustrating a part of a conventional semiconductor light-receiving device.

For better understanding of the invention, background technology is first described. FIG. 1 is a cross-sectional view, showing the fundamental structure of a conventional side-(wall) surface-incident semiconductor light-receiving device. The side-(wall) surface-incident semiconductor light-receiving device has a pin junction epi-wafer that includes an n-type buffer layer 12, an I-type light absorbing layer 13 and a p-type cap layer 14 laminated on a semiconductor substrate 11.

Figure 2:
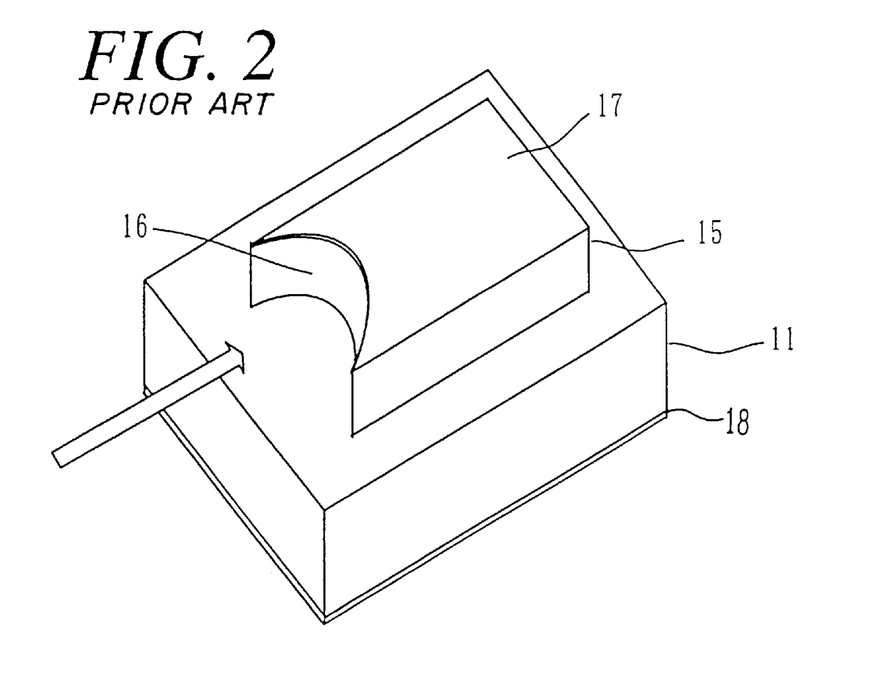
FIG. 2 is a perspective view illustrating a side-(wall) surface-incident type of a light-receiving device according to conventional technology.

FIG. 2 is an oblique perspective view, showing a semiconductor light-receiving device disclosed in Japanese Laid open patent publication H7-202263. A light-receiving section 15 is formed on the semiconductor substrate 11 by shaping the layered structure (12, 13 and 14), shown in FIG. 1, into a preferable shape.

One side-(wall) surface of the light-receiving section 15 is a light-receiving surface 16, which is arranged vertical to the upper surface of the semiconductor substrate 11. An electrode 17 is formed on the p-type cap layer 14 of the light-receiving section 15; and an electrode 18 is also formed on the back surface of the substrate 11.

In the side(wall) surface-incident semiconductor light-receiving device, light is not wave-guided to the I-type light absorbing layer 13 inside the device. Therefore, the coupling efficiency of light cannot be improved and the density of the electric charge becomes high only around the light-receiving surface 16. As a result, a deterioration of the signal frequencies is extracted through the buffer layer 12 or the cap layer 14. Providing a wave-guiding channel structure having a wave-guiding channel may solve this problem. The wave-guide channel structure wave-guides light to the I-type light absorbing layer 13 inside the device; however, the application of the wave-guiding channel structure significantly increases the manufacturing cost of semiconductor light-receiving devices and is thus impractical.

As shown in FIG. 2, the light-receiving surface 16 may be curved to improve the coupling efficiency of this semiconductor light-receiving device, thus enlarging the exposed area of the I-type light absorbing layer relative to the light-receiving surface 16.

However, the following problem is found in the conventional semiconductor light-receiving device shown in FIG. 2: Even though an improvement in the coupling efficiencies is attempted by increasing the exposed area of the I-type light absorbing layer 13 relative to the light-receiving surface 16 with e.g., the curved light-receiving surface 16, the coupling efficiency is still small and there is still technical dissatisfaction over a deterioration of frequencies.

First Preferred Embodiment

Figure 3:
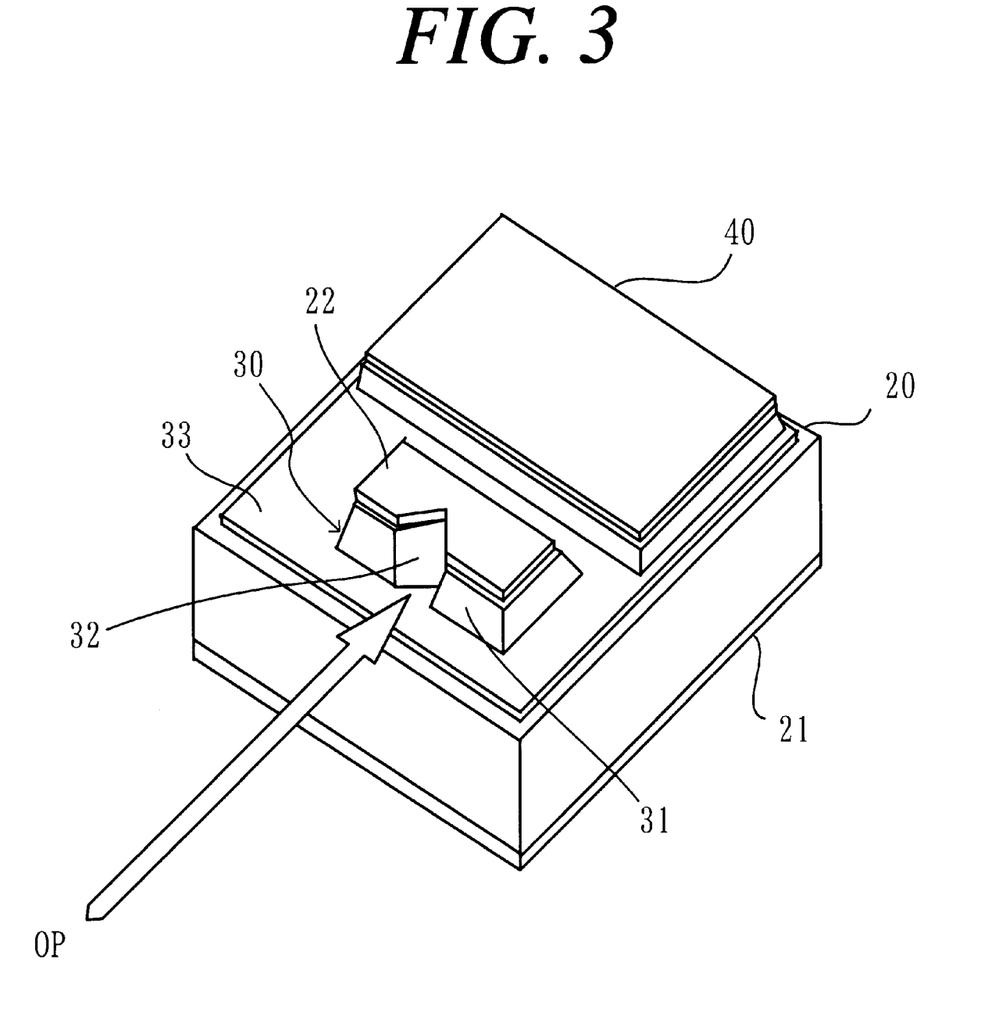
FIG. 3 is a perspective view illustrating a side-(wall) surface-incident type of a semiconductor light-receiving device according to a first preferred embodiment of the present invention.

FIG. 3 is an oblique perspective view of a semiconductor light-receiving device (light receptor) according to a first preferred embodiment of the present invention. This semiconductor light-receiving device is a side(wall) surface-incident type device made of an epi-wafer having the same structure as in e.g., FIG. 1, and includes a light-receiving section 30 and a support 40 on a surface of a semiconductor substrate 20. The light-receiving section 30 and the support 40 are formed by the same process, and have the same layered structure.

On the back surface of the substrate 20, a first electrode 21 for bias is deposited; and a second electrode 22 is arranged on the top surface of the light-receiving section 30. The support 40 is provided so as to package this semiconductor light-receiving device upside down, and the light-receiving section 30 is as tall as the support 40. The top view of the light-receiving section 30 is, for example, rectangular; and one side of the light-receiving section 30 is a light-receiving surface 31 where light OP enters. A concave groove 32 is formed in a vertical direction at the center of the light-receiving surface 31.

A thin film 33 is coated on the side-(wall) surface of the light-receiving section 30, groove 32, and a portion of a surface of the substrate 20.

FIGS. 4A, 4B, 4C and 4D are oblique perspective views showing the manufacturing procedure of the semiconductor light-receiving device, shown in FIG. 3. The same reference numerals are used for the common elements as in FIG. 1.

Figure 4A:
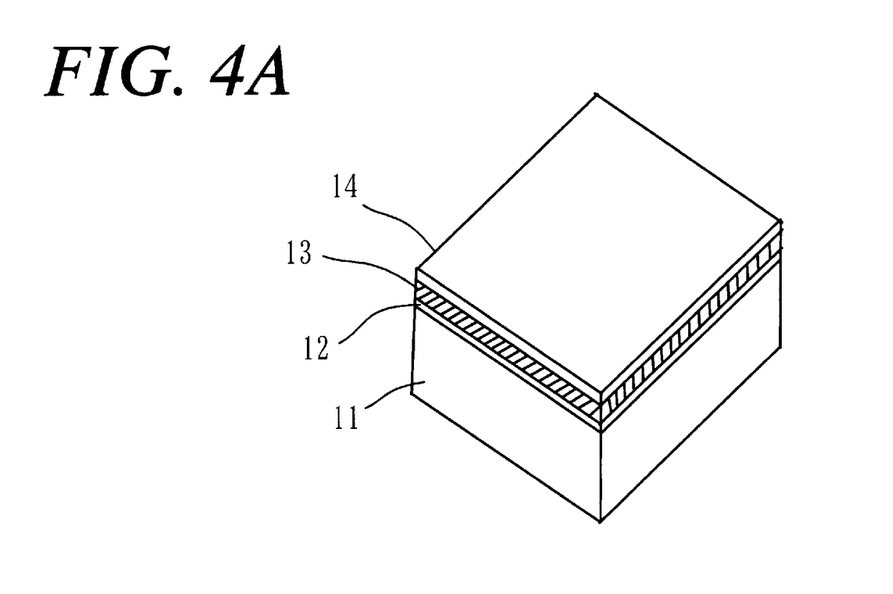
FIGS. 4A to 4D are perspective views showing fabrication steps of the semiconductor light-receiving device shown in FIG. 3.

In the process of FIG. 4A, on a first conductive n$^+$-InP semiconductor substrate 11, an n-InP buffer layer 12, an n$^-$-InGaAsP light absorbing layer 13 and a second conductive p$^+$-InP cap layer 14 are sequentially laminated by a crystal-growing method.

Figure 4B:
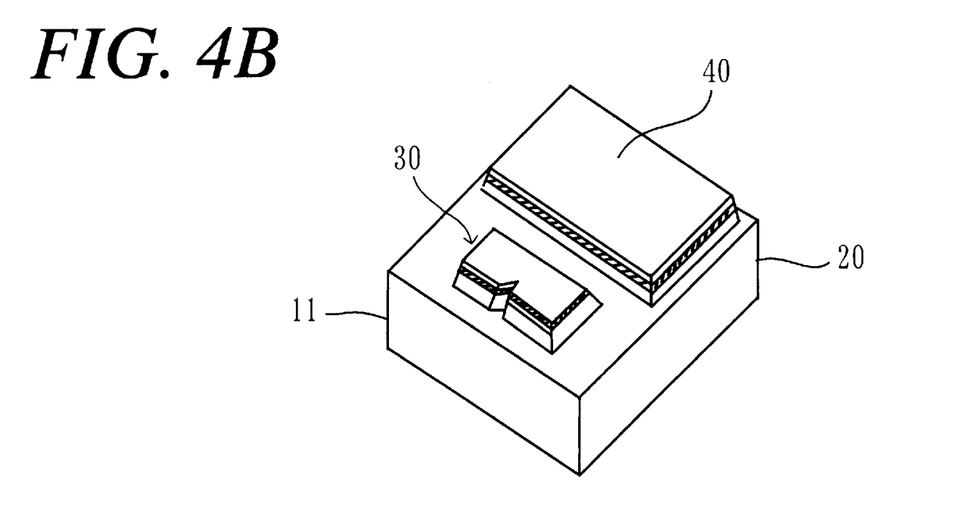

In the process of FIG. 4B, a mask pattern (not shown) is formed on the p$^+$-InP cap layer 14 for a light-receiving element. With the pattern as a mask, n-InP, n$^-$-InGaAsP and p$^+$-InP are etched with an etchant until the semiconductor substrate 11 is exposed. A mixed solution such as HBr:H$_2$O$_2$:HCL:H$_2$O (=50:10:100:100) is used as the etchant. A light-receiving section 30 with a groove 32 and a support 40 are formed by etching on the substrate 20, shown in FIG. 3.

Figure 4C:
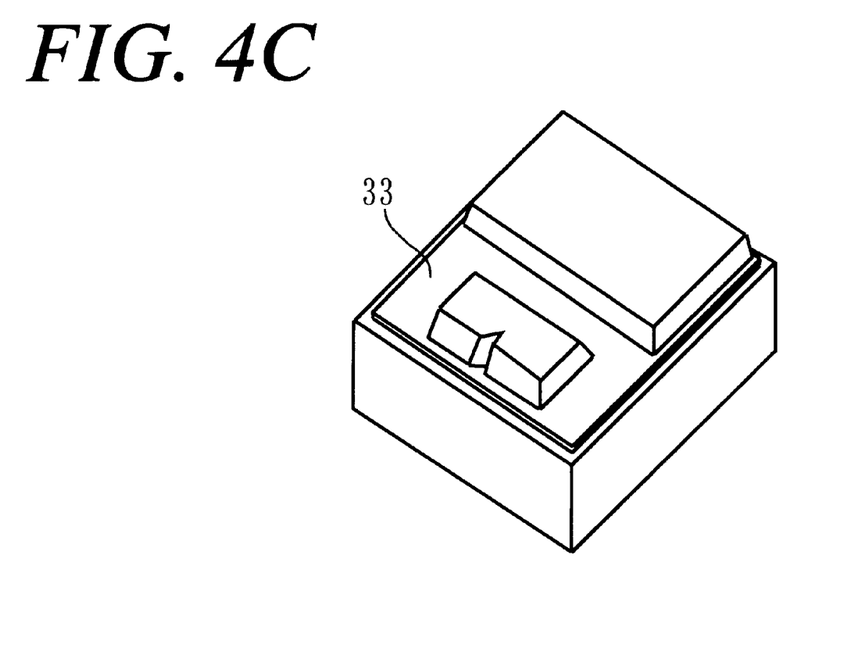

In the process of FIG. 4C, a Si$_3$N$_4$ film 33 is coated with a thickness of $\lambda/4n$ (where "$\lambda$" is a wavelength of light OP; and "n" is a refractive index of Si$_3$N$_4$) on the light-receiving surface 31 and the groove 32. The refractive index of Si$_3$N$_4$ is about 1.9, and is smaller than the refractive index of the n⁻-InGaAsP light absorbing layer 13. The $Si_3N_4$ film 33 has a photoluminescence wavelength that is shorter than that of the light absorbing layer 13.

Figure 4D:
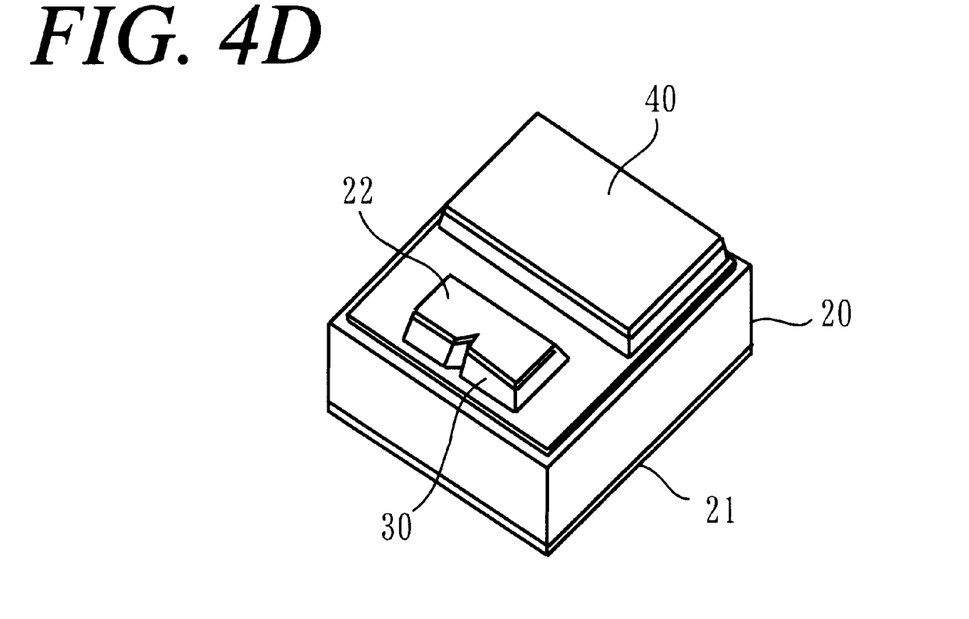

In the process of FIG. 4D, an electrode 22 of (Au/AuZn+ Ti/Pt/Au) is formed as a cathode on the p⁺-InP cap layer 14. An electrode 21 of (AuGeNi/Au+Cr/Au) is formed on the back surface of the n⁺-InP semiconductor substrate 11 as an anode. In the above described procedures, the semiconductor light-receiving device is fabricated as shown in FIG. 3.

Figure 5:
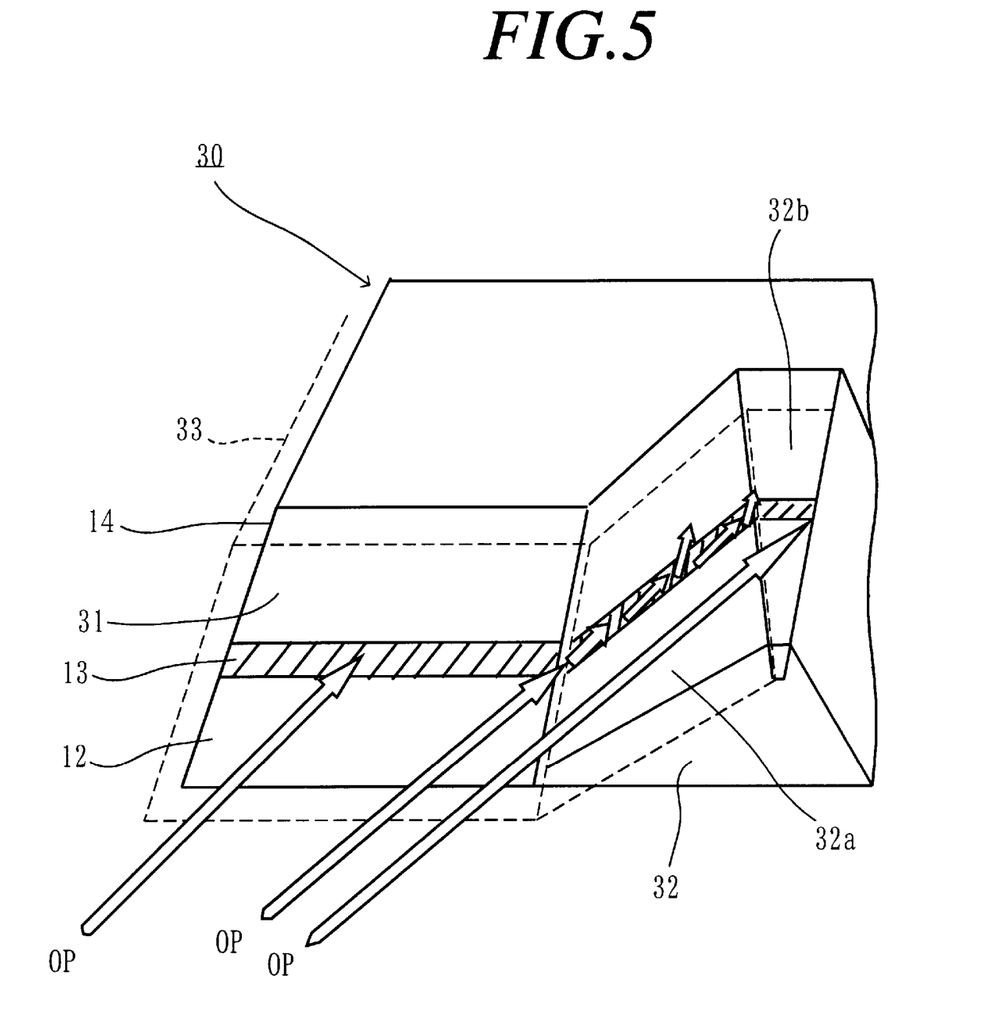
FIG. 5 is an enlarged perspective view of the semiconductor light-receiving device shown in FIG. 3, used for explaining the operation thereof.

FIG. 5 is a diagram explaining the incidence of light supplied to the semiconductor light receiving device, shown in FIG. 3. The operations of the semiconductor light-receiving device of FIG. 3 are explained with reference to this FIG. 5.

In the semiconductor light-receiving device of FIG. 3, incoming light (input light) OP from outside reaches the light-receiving surface 31 as well as the groove 32 formed in the light-receiving surface 31. The light-receiving area of the n⁻-InGaAsP light absorbing layer 13 is increased by the groove 32, thus increasing the coupling efficiency with the incoming light OP. The light OP that has reached the light-receiving surface 31 is absorbed around the surface of the n⁻-InGaAsP light absorbing layer 13 of the light-receiving surface 31.

As mentioned above, the $Si_3N_4$ film 33 has a refractive index (n) smaller than that of the $n^{p31}$-InGaAsP light absorbing layer 13 and has a photoluminescence wavelength shorter than that of the light absorbing layer 13. As a result, the light OP reaching the groove 32 is wave-guided to the n⁻-InGaAsP light absorbing layer 13 through the $Si_3N_4$ film 33 at a side (wall) surface 32a and a back surface 32b of the groove 32.

Local light absorption is prevented by this wave-guiding of light OP. At the n⁻-InGaAsP light absorbing layer 13 where the light OP was absorbed, electric charge is generated that becomes a carrier; and signals corresponding to the electric charge are outputted through the electrode 22. Light is not locally absorbed at the n⁻-InGaAsP light absorbing layer 13; therefore, the density of electric charge does not increase locally, coupling efficiency at the groove 32 increases, and at the same time, the properties of the frequencies of output signals improve.

Figure 6A:
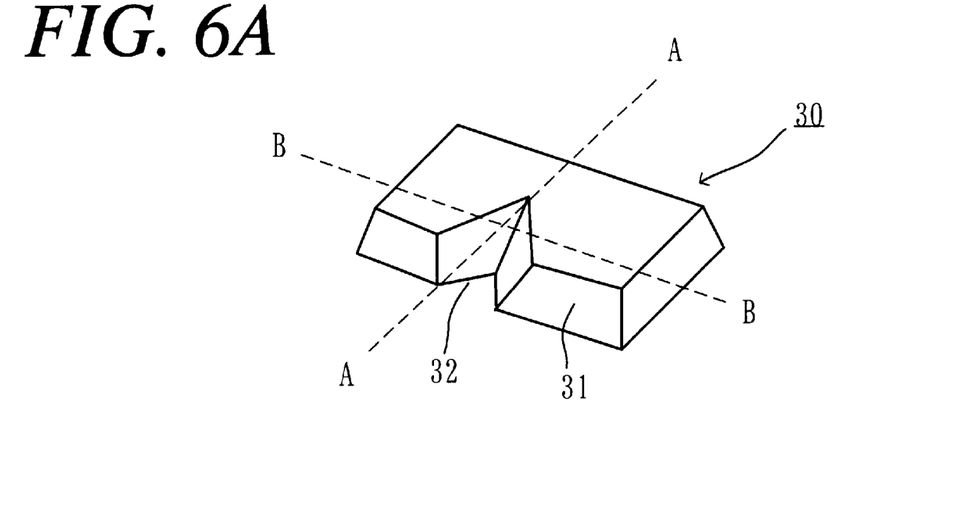
FIG. 6A is a perspective view illustrating a light-receiving section of the semiconductor light-receiving device, shown in FIG. 3.
Figure 6B:
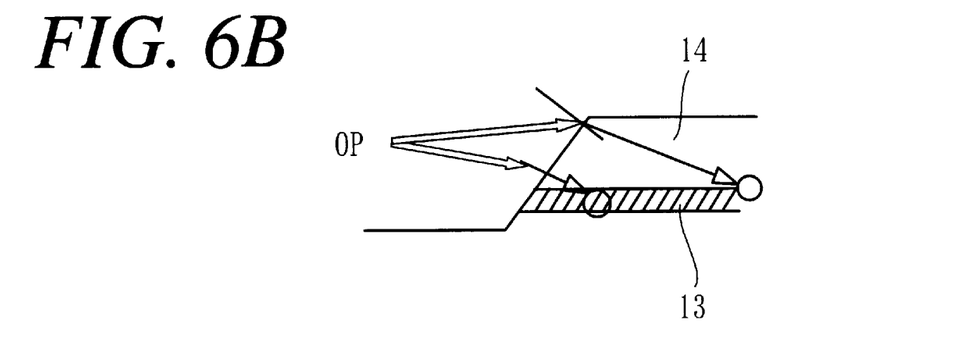
FIG. 6B is a cross sectional view taken on line A—A of FIG. 6A.
Figure 6C:
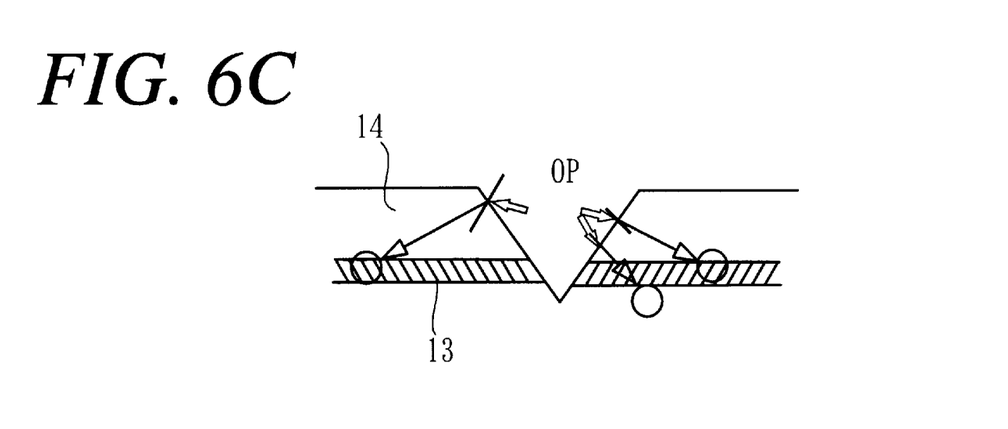
FIG. 6C is a cross sectional view taken on line B—B of FIG. 6A.

FIGS. 6A, 6B and 6C show the entire body as well as the cross-sections of the light-receiving section 30. In the light-receiving section 30 of FIG. 6A, mesa surfaces are used for sides of the light-receiving section 30 that correspond to the sides and back surfaces of the groove 32 formed in the light-receiving surface 31.

Figure 7A:
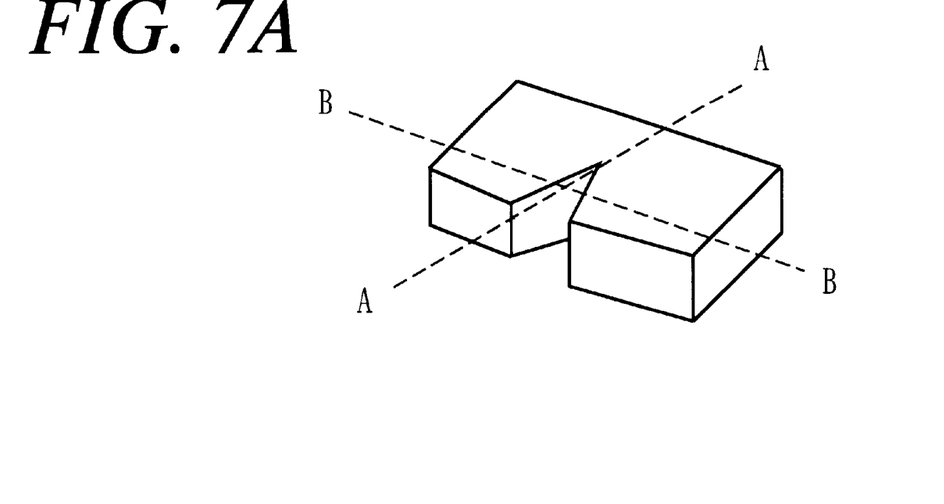
FIG. 7A is a perspective view illustrating a light-receiving section of a semiconductor light-receiving device as a reference.
Figure 7B:
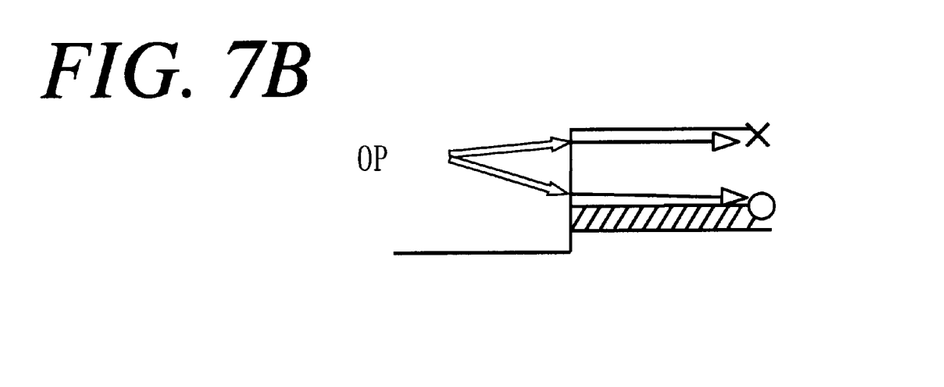
FIG. 7B is a cross sectional view taken on line A—A of FIG. 7A.
Figure 7C:
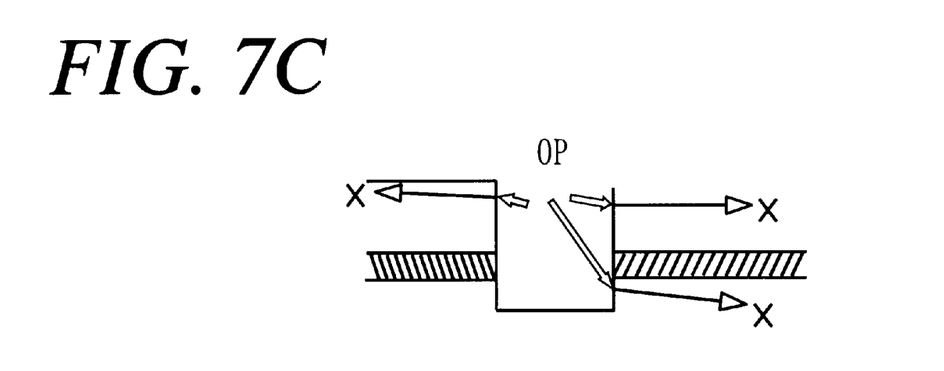
FIG. 7C is a cross sectional view taken on line B—B of FIG. 7A.

In FIG. 7A, the mesa surfaces are not used for those sides. The cross sections of the light-receiving section 30 taken on line A—A and on line B—B of FIG. 6A are shown in FIG. 6B and FIG. 6C, respectively. The cross sections of the light-receiving section 30 taken on line A—A and on line B—B of FIG. 7A are shown in FIG. 7B and FIG. 7C, respectively.

When mesa surfaces are used for side walls in the groove 32, the light OP that has entered the p⁺-InP cap layer 14 is refracted at the mesa surfaces shown in FIGS. 6B and 6C and reaches the n⁻-InGaAsP light absorbing layer 13. In other words, the effective light-receiving area of the n⁻-InGaAsP light absorbing layer 13 is increased compared with the one where no mesa surfaces are formed as in FIGS. 7B and 7C. Coupling loss is also reduced by adopting such mesa surfaces even in a case where the center of light-interception deviates in a vertical direction due to, for example, deviation of an optical axis of incident light OP, thus also improving tolerance.

As described above, the following advantages are achieved in the first preferred embodiment:

(i) The groove 32 is formed in the light-receiving surface 31 of the light-receiving section 30 and the $Si_3N_4$ film 33 is coated, so that local intensification of the density of the electric charge at the n⁻-InGaAsP light absorbing layer 13 is restrained. In addition, deterioration of frequencies in output signals can be prevented, and coupling efficiency improves. Therefore, a side (wall) surface-incident semiconductor light-receiving device can be constructed even in an economical epi-wafer that can technically satisfy frequency properties.

(ii) By applying mesa surfaces to the groove 32, local intensification of the density of the electric charge at the n⁻-InGaAsP light absorbing layer 13 is certainly restrained. In addition, the deterioration of frequencies in output signals can be prevented; and coupling efficiency improves. Therefore, a side (wall) surface-incident semiconductor light-receiving device can be constructed even in an economical epi-wafer that can technically satisfy frequency properties.

(iii) The groove 32 is formed at the center of the light-receiving surface 31 of the light-receiving section 30, so that coupling efficiency at the center of the light-receiving surface 31 is the highest. There is no need to search for another location that has good coupling efficiency in aligning an optical axis. In other words, the cost of mounting semiconductor light-receiving devices is reduced.

Second Preferred Embodiment

Figure 8:
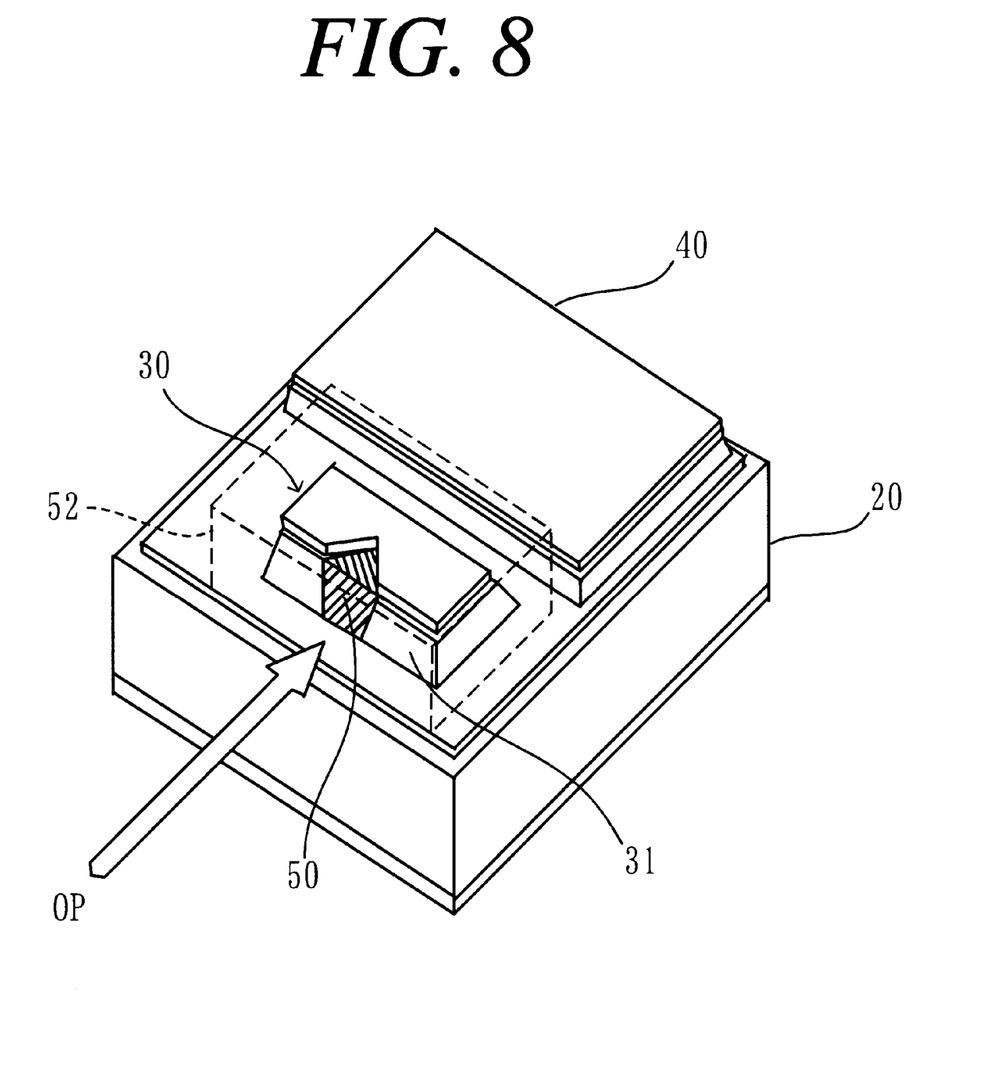
FIG. 8 is a perspective view illustrating a side-(wall) surface-incident type of a semiconductor light-receiving device according to a second preferred embodiment of the present invention.

FIG. 8 is a oblique perspective view of a semiconductor light-receiving device according to a second preferred embodiment of the present invention. The same reference numerals are used for identical elements in FIG. 3. A feature of the semiconductor light-receiving device is that a silicone 50 used as a wave-guiding channel is inserted into a groove 32 formed in a light-receiving surface 31 of a light-receiving section 30. The other components are the same as those in FIG. 3. TSE30332 is used for the silicone 50 that has a refractive index (n) of 1.4, manufactured by Toshiba Silicone Co., Ltd.

Figure 9A:
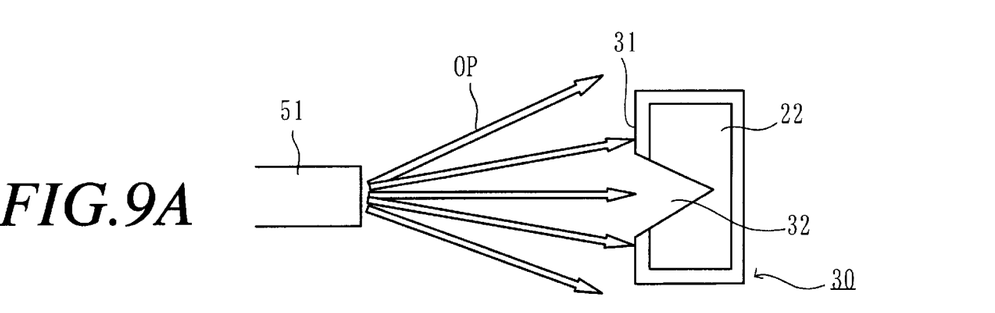
FIGS. 9A to 9C are operational views showing the operation of the semiconductor light-receiving device shown in FIG. 8.
Figure 9B:
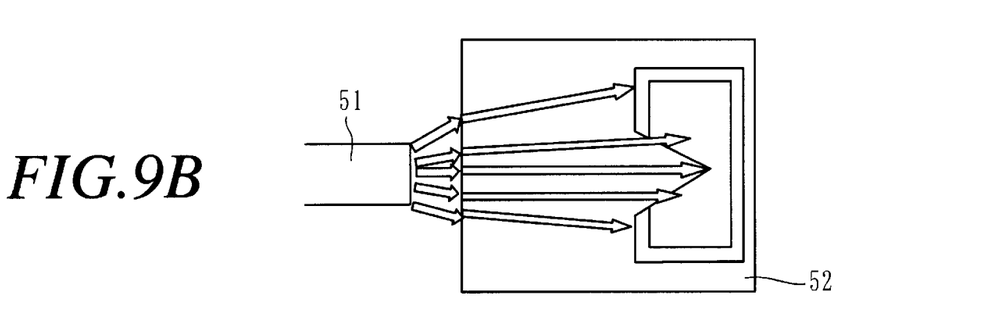
Figure 9C:
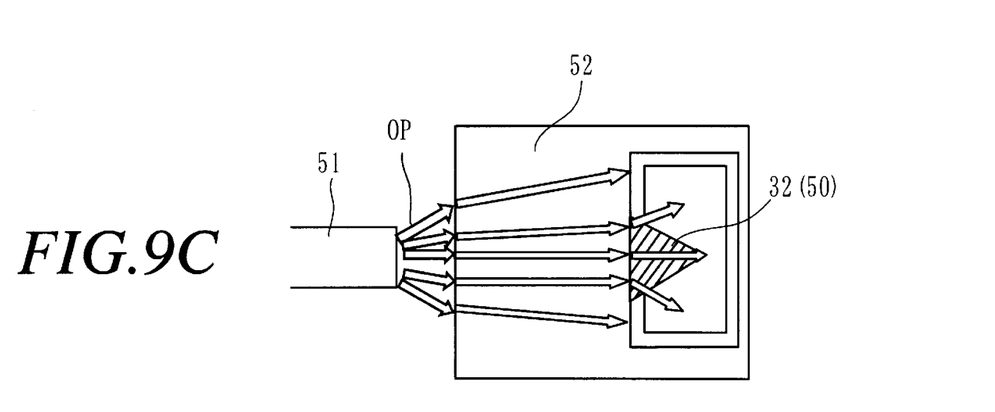

FIGS. 9A, 9B and 9C are plane views, explaining the function of the silicone 50 of FIG. 8. The light OP, irradiating from a single mode optical fiber 51 to the semiconductor light-receiving device, spreads in an atmosphere as shown in FIG. 9A For that reason, the light OP may not be entirely taken into the light-receiving surface 31 of the light-receiving section 30. Thus, as shown in FIG. 9B, the light-receiving section 30 is sealed with e.g., an epoxy resin 52 having about a 1.54 refractive index.

Due to the sealing with the epoxy resin 52, the light OP is not dispersed but focused. However, in sealing the light-receiving section 30 with the epoxy resin 52, the intensity of the light OP entering the groove 32 increases, thus locally intensifying the density of electric charge at the light absorbing layer 13 and possibly having the frequencies deteriorate.

In the semiconductor light-receiving device wherein the wave-guiding channel 50 is inserted into the groove 32, the silicone 50 has a smaller refractive index than the epoxy resin 52, so that the light OP that was focused on the groove 32 scatters in the entire groove 32. As a result, local intensification of the density of electric charge at the light absorbing layer 13 is prevented.

As described above, in this second preferred embodiment, the light-receiving section 30 is sealed with the epoxy resin 52. The silicone 50 having a smaller refractive index than the epoxy resin 52 is inserted into the groove 32 in the semiconductor light-receiving device. Therefore, it is prevented that local intensification of the density of the electric charge is formed at the light absorbing layer 13, corresponding to the groove 32 of the light-receiving section 30. As a result, a deterioration of the frequencies can be restrained.

Third Preferred Embodiment

Figure 10:
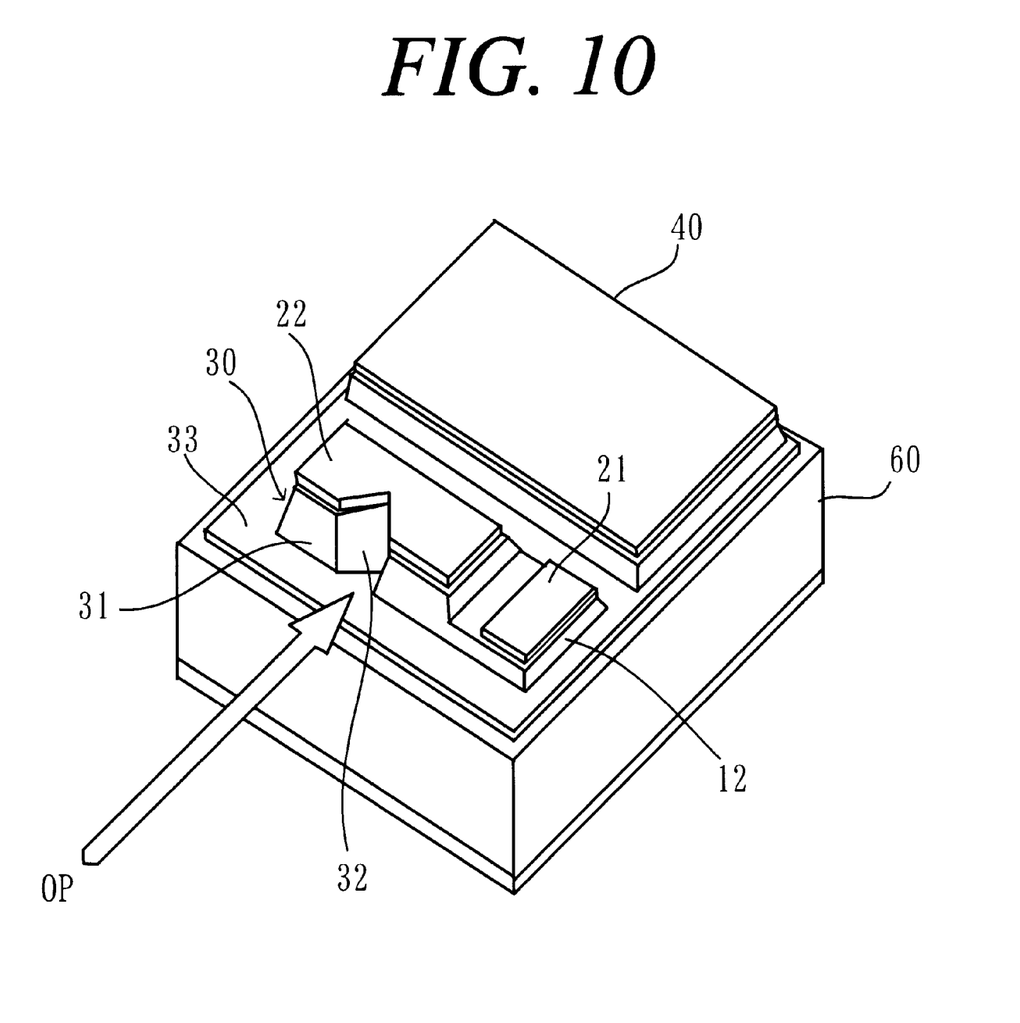
FIG. 10 is a perspective view illustrating a side-(wall) surface-incident type of a semiconductor light-receiving device according to a third preferred embodiment of the present invention.

FIG. 10 is an oblique perspective view, showing the structure of a semiconductor light-receiving device according to a third preferred embodiment of the present invention. The same reference numerals are used for identical elements in FIGS. 3 and 8.

In the first and second preferred embodiments, a semiconductor light-receiving device is formed on an $n^+$-InP semiconductor substrate 20 and an electrode 21 is arranged on the back surface of the substrate 20. As shown in FIG. 10, the semiconductor light-receiving device of this embodiment is formed on an insulating substrate 60.

As the substrate 60, an Fe-InP wafer, for instance, is used. On the substrate 60, a light-receiving section 30 is formed and at the same time, a buffer layer 12 is extended from the light-receiving section 30. An electrode 21 is also formed on the buffer layer 12. As a result, the electrode 21 is arranged on the upper surface of the substrate 60. The distance between the light absorbing layer 13 and the electrode 21 becomes short, making it possible to increase the speed of the operation.

In the present invention, mesa surfaces may also only be formed in the cap layer 14; by doing this, the same effects as in the first preferred embodiment are also provided. The composition of the epi-wafer, shown in FIG. 2, is not limited to the composition in the first and second embodiments; other compositions are also applicable.

It will be understood that the above description of the present invention is susceptible to various modifications, changes and adaptations, and the same are intended to be comprehended with the meaning and range of equivalents of the appended claims.

What is claimed is:

1. A semiconductor light-receiving device having a light-receiving section that receives an input light, comprising:
    a light-receiving surface to which the input light is incident;
    a light absorbing layer into which the incident light is absorbed;
    a groove extending vertically into the light-receiving surface, inside walls of the groove having a downward slope to refract the incident light to the light absorbing layer; and
    a thin film coated on the inside walls of the groove that channels the incident light to the light absorbing layer,
    the thin film having a refractive index that is smaller than a refractive index of the light absorbing layer and having a photoluminescence wavelength that is shorter than a photoluminescence wavelength of the light absorbing layer.

2. The semiconductor light-receiving device of claim 1, wherein the light-receiving section comprises a buffer layer of a first conductive type formed on a semiconductor substrate, the light absorbing layer formed on the buffer layer and a cap layer of a second conductive type formed on the light absorbing layer, wherein at least the Inside walls of the cap layer have a downward slope.

3. The semiconductor light-receiving device of claim 1, wherein the groove is arranged at a center of the light-receiving surface.

4. The semiconductor light-receiving device of claim 1, wherein the light absorbing layer is InGaAsP and the thin film is $Si_3N_4$.

5. The semiconductor light-receiving device of claim 1, wherein the thin film has a thickness of $\lambda/4n$, where "$\lambda$" is a wavelength of the input light and "n" is the refractive index of the thin film.

6. The semiconductor light-receiving device of claim 1, further comprising:
    an insulating substrate on which the light-receiving section is formed,
    the light-receiving section having a buffer layer of a first conductive type formed on the insulating substrate, the light absorbing layer formed on the buffer layer and a cap layer of a second conductive type formed on the light absorbing layer,
    the buffer layer extending horizontally from the light-receiving section, a first electrode being formed on the horizontally extending buffer layer and a second electrode being formed on the cap layer.

7. A semiconductor light-receiving device, comprising:
    a light-receiving section that receives an input light, the light receiving section having a buffer layer of a first conductive type formed on an insulating substrate, a light absorbing layer formed on the buffer layer and a cap layer of a second conductive type formed on the light absorbing layer,
    the light-receiving section having a sidewall light-receiving surface to which the input light is incident; and
    a groove extending vertically into the sidewall light-receiving surface, inside walls of the groove having a downward slope to refract the incident light to the light absorbing layer.

8. The semiconductor light-receiving device of claim 7, wherein at least the inside walls of the cap layer have a downward slope.

9. The semiconductor light-receiving device of claim 7, wherein the buffer layer extends horizontally from the light-receiving section, a first electrode being formed on the horizontally extending buffer layer and a second electrode being formed on the cap layer.

10. The semiconductor light-receiving device of claim 7, wherein the groove is arranged at a center of the light-receiving surface.

11. The semiconductor light-receiving device of claim 7, further comprising a thin film coated on the inside walls of the groove that channels the incident light to the light absorbing layer.

12. The semiconductor light-receiving device of claim 11, wherein the thin film has a refractive index that is smaller than a refractive index of the light absorbing layer and has a photoluminescence wavelength that is shorter than a photoluminescence wavelength of the light absorbing layer.

13. The semiconductor light-receiving device of claim 12, wherein the light absorbing layer is InGaAsP and the thin film is $Si_3N_4$.

14. The semiconductor light-receiving device of claim 12, wherein the thin film has a thickness of $\lambda/4n$, wherein "$\lambda$" is a wavelength of the input light and "n" is the refractive index of the thin film.

15. A semiconductor light-receiving device, comprising:
    a light-receiving section that receives an input light; and
    a resin member covering the light-receiving section,
    the light-receiving section comprising
        a sidewall light-receiving surface to which the input light is incident,
        a groove extending vertically into the light-receiving surface, inside walls of the groove having a downward slope to refract the input light into the light-receiving section, and a material filled in the groove that waveguides the input light into the light-receiving section, the material having a refraction index smaller than a refraction index of the resin member.

16. The semiconductor light-receiving device of claim 15, the light-receiving section having a buffer layer of a first conductive type formed on a semiconductor substrate, a light absorbing layer formed on the buffer layer and a cap layer of a second conductive type formed on the light absorbing layer, wherein at least the inside walls of the cap layer have a downward slope.

17. The semiconductor light-receiving device of claim 15, further comprising:

an insulating substrate on which the light-receiving section is formed, the light-receiving section having a buffer layer of a first conductive type formed on the insulating substrate, a light absorbing layer formed on the buffer layer and a cap layer of a second conductive type formed on the light absorbing layer, the buffer layer extending horizontally from the light-receiving section, a first electrode being formed on the horizontally extending buffer layer and a second electrode being formed on the cap layer.

18. The semiconductor light-receiving device of claim 15, wherein the groove is arranged at a center of the light-receiving surface.

19. The semiconductor light-receiving device of claim 15, wherein the resin member is an epoxy resin and the material is silicone.

* * * * *